United States Patent
Koops et al.

(10) Patent No.: US 8,575,511 B2
(45) Date of Patent: Nov. 5, 2013

(54) METHOD OF MARKING OR INSCRIBING A WORKPIECE

(75) Inventors: Arne Koops, Neu-Lankau (DE); Sven Reiter, Hamburg (DE)

(73) Assignee: tesa SE, Hamburg (DE)

( * ) Notice: Subject to any disclaimer, the term of this patent is extended or adjusted under 35 U.S.C. 154(b) by 573 days.

(21) Appl. No.: 12/623,800

(22) Filed: Nov. 23, 2009

(65) Prior Publication Data

US 2010/0133245 A1 Jun. 3, 2010

(30) Foreign Application Priority Data

Dec. 1, 2008 (DE) .......................... 10 2008 059 757

(51) Int. Cl.
*B23K 26/00* (2006.01)
(52) U.S. Cl.
USPC ..................................................... 219/121.6
(58) Field of Classification Search
USPC ..................................................... 219/121.6
See application file for complete search history.

(56) References Cited

U.S. PATENT DOCUMENTS

| | | | | |
|---|---|---|---|---|
| 4,960,050 A | * | 10/1990 | Hatch ............................ | 101/348 |
| 5,030,551 A | * | 7/1991 | Herren et al. .............. | 430/495.1 |
| 6,444,068 B1 | * | 9/2002 | Koops et al. .................... | 156/99 |
| 6,479,208 B1 | * | 11/2002 | Robertson ..................... | 430/258 |
| 2003/0039765 A1 | | 2/2003 | Hayakawa et al. | |
| 2003/0071020 A1 | | 4/2003 | Hong et al. | |
| 2005/0158673 A1 | * | 7/2005 | Hakey et al. .................. | 430/395 |
| 2009/0181313 A1 | * | 7/2009 | Koops et al. ..................... | 430/2 |

FOREIGN PATENT DOCUMENTS

DE 10 2005 055 174.2 B3 4/2007
WO 2007032900 A2 3/2007

OTHER PUBLICATIONS

European Search Report dated May 11, 2010.
German Search Report, dated Jul. 27, 2009.

* cited by examiner

*Primary Examiner* — William D Coleman
(74) *Attorney, Agent, or Firm* — Norris McLaughlin & Marcus, P.A.

(57) ABSTRACT

The present invention provides a method of marking or inscribing a workpiece (3) with high-energy radiation, more particularly with a laser beam (1), the workpiece (3) being transparent for the radiation wavelength, and a polymer matrix (7) being disposed in the vicinity of the workpiece (3) in such a way that the radiation passes through the workpiece (3) before it impinges on the polymer matrix (7), characterized in that disposed between the polymer matrix (7) and the workpiece (3) is a film (15) of liquid which is in contact with the polymer matrix (7) and with the workpiece (3).

7 Claims, 1 Drawing Sheet

METHOD OF MARKING OR INSCRIBING A WORKPIECE

BACKGROUND OF THE INVENTION (1) Field of the Invention

The present invention relates to a method of marking or inscribing a workpiece with high-energy radiation, more particularly with a laser beam, the workpiece being transparent for the radiation wavelength, and a polymer matrix being disposed in the vicinity of the workpiece in such a way that the radiation passes through the workpiece before it impinges on the polymer matrix.

(2) Description of Related Art

It is known that the use of laser radiation for machining the material of a workpiece is based fundamentally on absorption of the radiation and energetic conversion with subsequent processes such as vaporization, ionization, particulate removal and photochemical events. These processes may take place in the workpiece itself, producing markings or inscriptions in the form, for example, of engraving, or else another material is deposited locally on the workpiece, as part of laser beam evaporation (pulsed laser deposition, PLD), for example. Variants of pulsed laser deposition take place in particular in the case of workpieces whose material is transparent for the wavelength of the laser radiation that is used.

The absorbing polymer matrix is disposed, for example, in direct contact with the transparent workpiece, and so the laser beam passes through the workpiece and, on impinging on the interface between workpiece and polymer matrix, vaporizes the material of the polymer matrix and is deposited on the surface of the workpiece in the form of a marking or inscription.

The methods known in this respect have a number of disadvantages. First, for maximum resolution of the marking or inscription, the distance between workpiece and polymer matrix must be as small as possible, so that the vaporized material is deposited over as small as possible an area of the workpiece. For this purpose, for example, a polymer matrix in the form of a transfer film may be adhered to the workpiece. If, however, the surface of the workpiece that is to be inscribed is rough, damp, uneven or soiled, there is often, at least locally, no direct contact between polymer matrix and workpiece. This may be caused by inclusion of air bubbles or other liquid or solid impurities or unevennesses. A distance between polymer matrix and workpiece then brings with it a number of disadvantages. First, there are two additional interfaces between the workpiece (optically dense) and air (optically thin), on the one hand, and air (optically thin) and polymer matrix (optically dense) on the other. This results in unwanted losses through scattering and reflection, with part of the power of the laser radiation not being available for the desired vaporization process, but instead, unwantedly, or even damagingly, heating up regions of the workpiece and/or of the polymer matrix. Secondly, the material removed from the polymer matrix is distributed over an areal region which is proportionately greater in line with the distance between polymer matrix and workpiece. As a result, the resolution of the marking or inscription becomes poorer. Moreover, the greater the distance between polymer matrix and workpiece, the smaller the fraction of the amount of material deposited on the workpiece as a proportion of the amount of material removed from the polymer matrix. Furthermore, in order to generate a particular reaction product which is to serve as a marking or inscription, it may be necessary for reactants provided in the polymer matrix to react in a closed reaction space to form the product. As a result of an opening to an air gap between polymer matrix and workpiece, the formation of such a reaction space may not be achieved. Finally, the removal of material from the polymer matrix produces what is referred to as smoke, which contains unwanted by-products which likewise originate from the polymer matrix. As little as possible of this smoke should become mixed on the workpiece in the form of debris in or around the marking or inscription. The production of smoke is greater when there is air included between polymer matrix and workpiece, and is a cause of untidy results.

In addition to a method with a solid polymer matrix, there are laser methods known which are based on increasing the near-surface absorption of laser radiation through a liquid. In this case, deliberately, an absorbing medium is used, typically an organic liquid. In this method, the transparent workpiece is in contact with the liquid at its back side, the side to be machined, and the laser radiation enters through the front side. The absorption of the laser radiation in the liquid produces, via heat transport from the heated liquid, a rapid increase in temperature to beyond the melting and vaporization point of the glass matrix. This method, which is referred to as laser-induced back side wet etching (LIBWE), leads to removal of material from the glass surface, and is used for the microstructuring or microengraving of glass.

Where a wetting absorber liquid is selected, it is indeed possible to avoid inclusion of air—unwanted for the reasons given above—between liquid and workpiece. A disadvantage of a liquid absorber, however, is that it does not allow localized removal of material and subsequent localized deposition on the workpiece, but instead only removal of material from the workpiece, produced by heat transfer—in other words, for example, only engraving.

It is an object of the present invention, therefore, to provide an improved method of marking or inscribing a workpiece with high-energy radiation, more particularly with a laser beam, in which the disadvantages of the known methods are overcome and it is possible to carry out marking or inscription even of rough, damp, uneven or soiled surfaces of the workpiece with high quality and resolution.

This object is achieved by a method according to Claim 1. Preferred embodiments are subject matter of the dependent claims.

BRIEF SUMMARY OF THE INVENTION

The present invention provides a method of marking or inscribing a workpiece with high-energy radiation, more particularly with a laser beam. The workpiece is transparent for the radiation wavelength, and a polymer matrix is disposed in the vicinity of the workpiece in such a way that the radiation passes through the workpiece before it impinges on the polymer matrix. The characteristic feature of the method is that disposed between the polymer matrix and the workpiece is a film of liquid which is in contact with the polymer matrix and with the workpiece.

A polymer matrix for the present purposes is any matrix based on polymeric constituents. Besides the polymeric constituents, the matrix may also comprise any desired non-polymeric constituents; only the main constituent ought to be polymeric in nature. The term "polymer matrix" also refers more particularly to a mixture of base polymers. In a particularly preferred embodiment, the polymer matrix is a thermoset polymer matrix. It has been found that thermosets in particular are especially suitable for marking or inscribing a workpiece.

The inventive disposal of the film of liquid overcomes a number of disadvantages of the prior art. On the one hand, a distance between workpiece and polymer matrix, in the case of a surface of the workpiece to be marked or inscribed that is rough, damp, uneven or soiled, is filled out by the liquid. When the—preferably wetting—film of liquid has a refractive index similar to that of the workpiece, the optically rough surface becomes smoothed, and so, on its exit from the workpiece, the laser beam is able to pass through without disruptive total reflections and scatterings induced by the optically rough surface, and with a considerably reduced degree of reflection. Furthermore, the film of liquid restricts the widening of the area over which the material of the polymer matrix is deposited. Indeed, as a result of the high energy input, there is local vaporization of the film of liquid, with the formation of a tunnel-like bubble through which the removed material moves, with lateral bounding, towards the workpiece. Therefore, despite a distance between workpiece and polymer matrix, the resolution is not substantially affected. Moreover, the film of liquid prevents the formation of smoke, or the smoke is dissolved or suspended in the film of liquid. This substantially enhances the quality and cleanness of the marking and inscription. The method of the invention also has an advantage over direct contact between workpiece and polymer matrix, namely the function of the film of liquid as a heat insulation layer or thermal dissipation layer, which minimizes unwanted heating of the workpiece. The film of liquid is preferably very widely transparent for the laser radiation, and consequently absorbs hardly any laser radiation energy itself, but instead absorbs only the heat of the heated polymer matrix. This heat is transported away through conduction and convection, with movement, through the local evaporation of the liquid, and is not transferred in a locally concentrated way to the workpiece.

In order to minimize reflection at the interfaces between workpiece and the medium it is advantageous if the liquid or viscoelastic medium has a refractive index similar to that of the material of the workpiece. It has been found that sufficiently good results are obtained with a difference in the refractive indices of less than 0.5.

The radiation source used is preferably a laser which is suitable for marking, inscribing or engraving workpieces. This is, for example, a fibre-coupled solid-state diode laser such as, for instance, a FAYb fibre laser (fibre-amplified ytterbium) with a wavelength of 1064 nm and an average power of 12 to 15 W. Since, therefore, radiation in the wavelength range of 600 nm-1500 nm is used, it is advantageous if the liquid or viscoelastic medium in the wavelength range of 600 nm-1500 nm exhibits no absorption or has a degree of absorption of less than 10%. The same applies to the material of the workpiece, which is preferably a glass substrate. In contrast to the above-described LIBWE method, then, the liquid used here possesses little or no absorption capacity at the wavelength used.

In one preferred embodiment of the method of the invention the radiation induces removal of material from the polymer matrix and the film of liquid takes up removed constituents of the polymer matrix and/or products formed therefrom.

The polymer matrix may have, for example, a titanium donor and also a carbon donor. A titanium donor is pure titanium or a titanium compound which has an affinity for providing free titanium as a reactant in a short time on exposure to energy. Where appropriate, the free titanium may also be provided via the route of a titanium-containing intermediate. The carbon donor provides free carbon, especially under irradiation with energy. The carbon donor may be a carbon compound and/or free, unbonded carbon. This carbon donor may be provided by the polymer matrix itself, or else there may be an additional carbon component present, in the form of carbon black, for example. Moreover, the polymer matrix may also comprise further components such as polymers, absorbers, etc., for example. As a result of the radiation, the titanium and carbon reactants are provided, as a result, for example, of disruption of a titanium compound and of a carbon compound, and, under the action of radiation, the desired titanium carbide product is formed. Preferably, at a local temperature of 1700° C. to 2200° C., titanium dioxide is reduced using carbon black or ultra-pure graphite to titanium carbide and carbon monoxide. The radiation here produces the temperature that is necessary for the reaction in the reaction space.

The polymer matrix is such that it reacts to laser irradiation predominantly by pulverization, thereby releasing the individual reactants, more particularly titanium and carbon, and making them available for the reaction to titanium carbide.

In addition it has emerged as being advantageous if, for the film of liquid, a liquid is selected which in the wavelength range of 600-1500 nm exhibits no absorption or has a degree of absorption of less than 10%, and radiation in the wavelength range of 600-1500 nm is used. For the film of liquid it is possible to select a sol, a gel or a viscoelastic substance, it being possible for the film of liquid to have a thickness of 250 nm to 10 mm.

The liquid may also itself include constituents which are provided as reactants or catalysts for desired reactions. For this purpose, in the film of liquid, it is possible, where appropriate, for ions to dissolve which are ready as reactants or catalysts for a desired reaction to form a product, it then being possible for the product to deposit on the workpiece on exposure to high-energy radiation.

The film of liquid preferably, on exposure to the radiation, undergoes a local change in its aggregate state, and in particular becomes gaseous. This creates a spatially confined, tunnel-like space for the deposition of the removed material or of the products thereof over a very small area of the workpiece.

BRIEF DESCRIPTION OF THE SEVERAL VIEWS OF THE DRAWING(S)

In the text below, a preferred embodiment of the method is elucidated in more detail with reference to the attached figures.

DETAILED DESCRIPTION OF THE INVENTION

Figure 1:
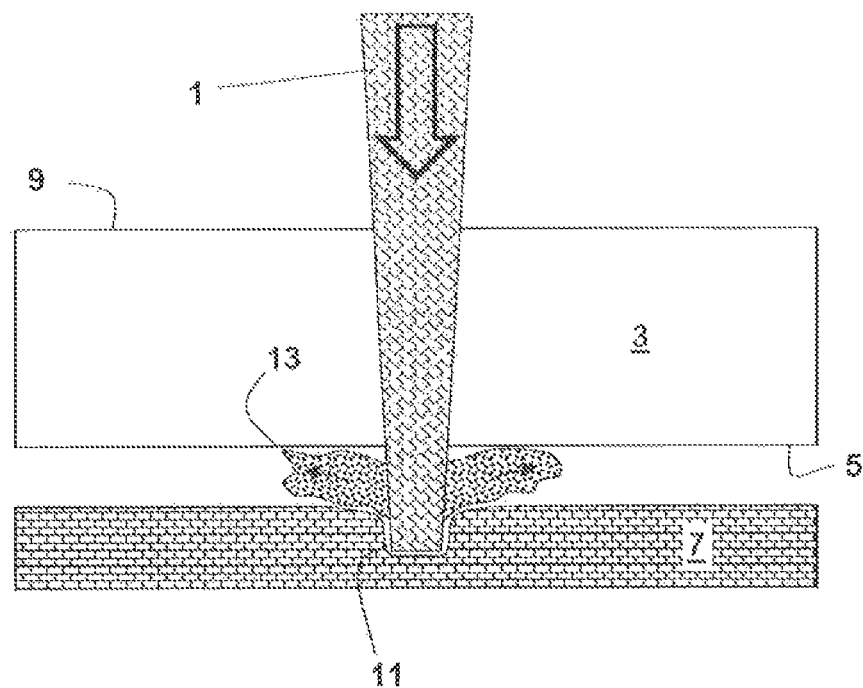
FIG. 1 shows a disadvantageous method in which there is a layer of air between workpiece and polymer matrix.

FIG. 1 shows how a laser beam 1 is directed onto a workpiece 3 in the form of a glass substrate which is to be marked or inscribed on a surface 5. Disposed in the vicinity of the surface 5 of the workpiece 3, with a distance, is a polymer matrix 7. Thus there is an air gap between polymer matrix 7 and workpiece 3. The air gap may be disposed deliberately or undeliberately as a result of a roughness, unevenness, dampness or soiling on the surface 5 of the workpiece or the polymer matrix 7. The workpiece 3 is transparent for the wavelength of the laser beam 1, whereas the polymer matrix 7 primarily absorbs the laser beam 1. The laser beam 1 enters the workpiece 3 via a surface 9 of the workpiece 3, which is opposite to the surface 5 to be marked, and passes through the workpiece 3 and impinges on the polymer matrix 7, which absorbs the laser beam 1 and heats up until the thermal energy is so great that the polymer matrix 7 is pulverized.

As a result of the pulverization, a reaction space 11, which is open towards the air gap, is produced within the polymer matrix 7, and this reaction space 11 contains the reactants, in the pulverized material, that are ready for a desired reaction. The reactants in this example are titanium dioxide and pure carbon in the form of carbon black, the intention being that the titanium dioxide should be reduced to titanium carbide, as a product for deposition in the form of a marking or inscription, at a local temperature, produced by the radiation, of 1700° C. to 2200° C. Since, however, the reaction space 11 is open towards the air gap, the pulverization produces severe development of smoke 13 and other unwanted by-products. The material removed escapes prematurely with the smoke 13 and other by-products from the reaction space 11 into the air gap, without any reaction to titanium carbide and without deposition on the surface 5 of the workpiece 3. The surface 5 of the workpiece 3 is merely soiled with smoke and other unwanted by-products.

Figure 2:
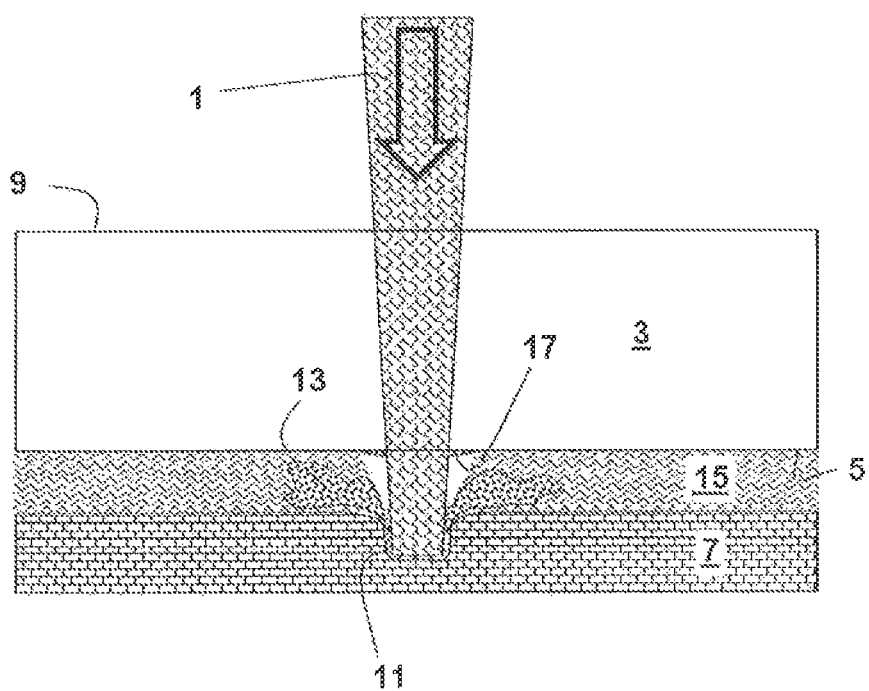
FIG. 2 shows an advantageous method in which there is a film of liquid between workpiece and polymer matrix.

FIG. 2 shows an advantageous embodiment of the method, in which a film 15 of liquid is disposed between the surface 5 of the workpiece 3 and the polymer matrix 7. For this purpose, the surface 5 of the workpiece 3, or the polymer matrix 7, is sprinkled by a pipette with a quantity of 0.1 ml of liquid, and distributed in a region of 5 cm×5 cm. As a result of the surface tension it may be necessary to generate a uniform film of liquid by moving the glass plate, or by using an air jet, or to make the liquid wetting by means of additives. The liquid is demineralized water, which is frequently used in the chemical and pharmaceutical industries. Thereafter the polymer matrix, as a film of material, is applied to the film 15 of liquid so as to form a film 15 of liquid having a thickness of 20 µm to 100 µl. For this purpose it is also possible to apply the liquid to the polymer matrix 7 and, by placing the workpiece 3 in a size of 48×14 mm onto the droplet formed by the surface tension, to bring about uniform distribution of the liquid. The film thickness may be defined by means of a spacer between polymer film 7 and glass 3. It may be necessary to ensure that the film layer is distributed homogeneously and without accumulations of air at the interfaces.

The laser radiation is generated using a solid-state laser (not shown) which emits a wavelength of 1064 nm. It is preferred to use a fibre-coupled diode laser, such as that available from the company Panasonic Electric Works Europe AG in Germany under the trade name "SunX LP-V10". The laser radiation used, therefore, has a wavelength of 1064 nm, for which glass and water are transparent.

Because the glass possesses a small coefficient of absorption, the laser beam 1 passes through this medium and crosses to the interface between glass 3 and water 15. At this wavelength, water too possesses no absorption capacity and allows the laser beam to impinge with virtually no loss on the polymer matrix 7.

In the interaction of the laser beam with the polymer matrix 7, the matrix reacts, as was the case in the method of FIG. 1, by pulverization. The shockwave which forms, as a result of additional gaseous expansion, causes smoke 13 and by-products to be catapulted into the layer 15 of liquid and dissolved and/or suspended therein. The reaction space 11 formed in the polymer matrix 7 is initially bounded upwardly by the film 15 of liquid, and so the pulverized material of the polymer matrix 7, on exposure to the laser beam 1, heats up to 1700° C. to 2200° C. in the reaction space 11, and titanium carbide is able to form as a product of titanium dioxide and carbon reactants provided by the pulverized polymer matrix 7. In the course of this process there is also local vaporization of the film 15 of liquid, which forms a tunnel-like bubble which propagates until reaching the surface 5 of the workpiece 3. The explosive shockwave pushes titanium carbide onto the surface 5 of the workpiece 3, whereon the titanium carbide undergoes locally bounded deposition. As a result of lateral displacement of the laser beam 1 or the workpiece 3, together with polymer matrix 7 and film 15 of liquid, it is then possible for a substantially two-dimensional structure of titanium carbide to be deposited on the glass surface 5.

After this operation, the polymer matrix 7 is detached from the glass plate 3, and the film 15 of liquid, containing smoke and particles, is removed, leaving the deposited titanium carbide permanently on the glass surface 5 in the form of a marking or inscription 17.

The invention claimed is:

1. A method of permanently applying a mark on a workpiece by marking or inscribing the workpiece comprising the steps of:
    providing high-energy radiation with a laser beam having a radiation wavelength,
    providing the workpiece which is transparent for the radiation wavelength,
    disposing a polymer matrix in the vicinity of the workpiece, the polymer matrix being separated from the workpiece by a gap in such a way that the radiation passes through the workpiece without absorbing any radiation before impinging on the polymer matrix, causing pulverization of the polymer matrix and forming reactants, the reactants being deposited in the form of markings on the surface of the workpiece, wherein, the gap is filled with a film of liquid which is in contact with the polymer matrix and with the workpiece, and
    wherein the film of liquid and the workpiece have refractive indices which differ by less than 0.5.

2. The method according to claim 1, wherein the radiation induces removal of material from the polymer matrix, and the film of liquid takes up removed constituents of the polymer matrix and/or products formed therefrom.

3. The method according to claim 1, further comprising the step of selecting for the film of liquid, a liquid, which in the wavelength range of 600-1500 nm exhibits no absorption or has a degree of absorption of less than 10%, and radiation in the wavelength range of 600-1500 nm is used.

4. The method according to claim 1, wherein for the film of liquid a sol, a gel or a viscoelastic substance is selected.

5. The method according to claim 1, wherein the film of liquid has a thickness of 250 nm-10 mm.

6. The method according to claim 1, wherein ions dissolve in the film of liquid that are ready as reactants for a desired reaction to form a product, the product depositing on the workpiece from exposure to high-energy radiation.

7. The method according to claim 1, wherein, on exposure to the radiation, the film of liquid locally changes its aggregate state and becomes gaseous.

\* \* \* \* \*